US006838829B2

(12) United States Patent
Ives

(10) Patent No.: US 6,838,829 B2
(45) Date of Patent: Jan. 4, 2005

(54) DEPRESSED COLLECTOR FOR ELECTRON BEAMS

(75) Inventor: R. Lawrence Ives, Saratoga, CA (US)

(73) Assignee: Calabatas Creek Research, Inc., Saratoga, CA (US)

( * ) Notice: Subject to any disclaimer, the term of this patent is extended or adjusted under 35 U.S.C. 154(b) by 0 days.

(21) Appl. No.: 10/038,016

(22) Filed: Jan. 3, 2002

(65) Prior Publication Data

US 2003/0122491 A1 Jul. 3, 2003

(51) Int. Cl.[7] .............................. H01J 23/02; H03F 3/56
(52) U.S. Cl. .......................................... 315/5.38; 330/45
(58) Field of Search ............................ 315/3, 3.5, 5.19, 315/5.33, 5.38, 5.41; 330/43, 45, 46, 48, 56, 308, 309

(56) References Cited

U.S. PATENT DOCUMENTS 3,717,787 A * 2/1973 Doyle ........................ 315/3.5
3,780,336 A * 12/1973 Giebeler ..................... 315/5.38
3,824,425 A * 7/1974 Rawls, Jr. ..................... 315/3.5
5,650,751 A * 7/1997 Symons ........................ 330/45
6,060,832 A * 5/2000 Adler et al. ............... 315/5.38
6,111,358 A * 8/2000 Cardwell et al. ............ 315/3.5
6,208,079 B1 * 3/2001 Brown, II .................... 315/3.5
6,380,803 B2 * 4/2002 Symons ........................ 330/45
6,429,589 B2 * 8/2002 Schult ........................ 315/5.37

* cited by examiner

*Primary Examiner*—Don Wong
*Assistant Examiner*—Minh Dieu A
(74) *Attorney, Agent, or Firm*—Jay A. Chesavage

(57) ABSTRACT

A depressed collector for recovery of spent beam energy from electromagnetic sources emitting sheet or large aspect ration annular electron beams operating aver a broad range of beam voltages and currents. The collector incorporates a trap for capturing and preventing the return of reflected and secondary electrons.

29 Claims, 3 Drawing Sheets

DEPRESSED COLLECTOR FOR ELECTRON BEAMS

STATEMENT REGARDING FEDERALLY SPONSORED RESEARCH AND DEVELOPMENT

This invention was made with government support under Grant NAS3-00079 awarded by NASA. The government has certain rights in this invention.

BACKGROUND OF THE INVENTION

1. Field of the Invention

The present invention relates to electromagnetic wave sources utilizing rectangular sheet electron beams or annular electron beams, and more particularly, to an electron beam collector for such devices which allows for recovery of spent beam energy by the application of device geometry and voltage depression.

2. Background Art

Linear beam electron devices are used in molecular spectroscopy, surveillance devices and sophisticated communications and radar systems that require generation or amplification of radio frequency or microwave electromagnetic signals. In UHF transmitters, the klystron is the most common power output device. However, a klystron with no efficiency optimizing circuitry is typically only 40 to 50% efficient depending on the type of device used. One scheme devised to improve klystron efficiency is the depressed collector, which allows for the recovery of energy from the electron stream rather than dissipating the energy as heat.

Depressed collectors have routinely been incorporated in cylindrically symmetric vacuum tubes, such as traveling wave tubes and klystrons for more than 40 years. Depressed collectors for cylindrical devices are produced by many companies including Communications and Power Industries, Northrop-Grumman, Hughes and Teledyne.

Previous implementations of depressed collectors have utilized the space charge forces in the electron beam to expand the electrons radially where they can be collected on surfaces that are facing in a direction away from the main body of the device. Other implementations use variations of the magnetic field to prevent return of secondary electrons.

Despite the advantages of depressed collectors, no implementations of such devices have been reported for use with sheet electron beams, such as those which are utilized in submillimeter frequency Backward Wave Oscillators. The current generation of submillimeter frequency Backward Wave Oscillators typically operate with efficiencies of less than five percent. Consequently, most of the energy in the electron beam is deposited in the collector of the device where it must be dissipated as thermal power and typically requires cooling. The successful implementation of a depressed collector would allow for recovery of most of the electron beam energy, reducing the electrical power requirements for the device and reducing the thermal power that must be dissipated.

Unfortunately, many devices including the submillimeter frequency Backward Wave Oscillator are not amenable to the techniques utilized to implement depressed collectors in the prior art such as cylindrically symmetric vacuum tubes, traveling wave tubes and klystrons. Simple depression of the existing collector geometry results in excessive generation of backscattered electrons and true secondary electrons. At the voltages used in the submillimeter frequency Backward Wave Oscillator device, the secondary electron yield can approach one, meaning that almost as many secondary electrons are generated as there are incoming primary electrons. The secondary electrons are accelerated at full voltage and impact on the main body of the device severely limiting the amount of energy that can be recovered from the electron beam.

An additional complication is the rectangular geometry of a device utilizing a rectangular sheet electron beam. The rectangular geometry is not amenable to the cylindrical geometrical configurations utilized in the prior art.

Finally, the Backward Wave Oscillator device operates at small currents (typically 30 to 40 milli-amperes) where space charge forces are small and techniques to control beam spread are limited by the presence of a strong, uniform magnetic field. Nor is the device amenable to the use of induced variations in the magnetic field to achieve beam spread because the distance between the body of the device and the collector is inadequate in that the distance is less than 100 microns. Variations of the magnetic field on this scale would be difficult to implement without adversely affecting beam transmission through the circuit.

SUMMARY OF THE INVENTION

The invention is a depressed collector for use with an electromagnetic wave device generating an electron beam. The collector incorporates an innovative electron trap to prevent the return of reflected electrons or true secondary electrons to the body or electron gun of the device. Spent beam energy is recovered by the use of voltage depression and electron trapping, thereby greatly increasing the efficiency of the device by recovering a significant amount of the spent beam energy and reducing or eliminating the need for cooling.

DESCRIPTION OF THE INVENTION

The present invention provides a depressed collector capable of recovering energy from an electron beam emerging from the interaction region of a device producing electromagnetic wave radiation. The depressed collector incorporates an innovative electron trap and voltage depression to prevent the return of reflected electrons or true secondary electrons to the body or to the electron gun of the device.

Figure 1:
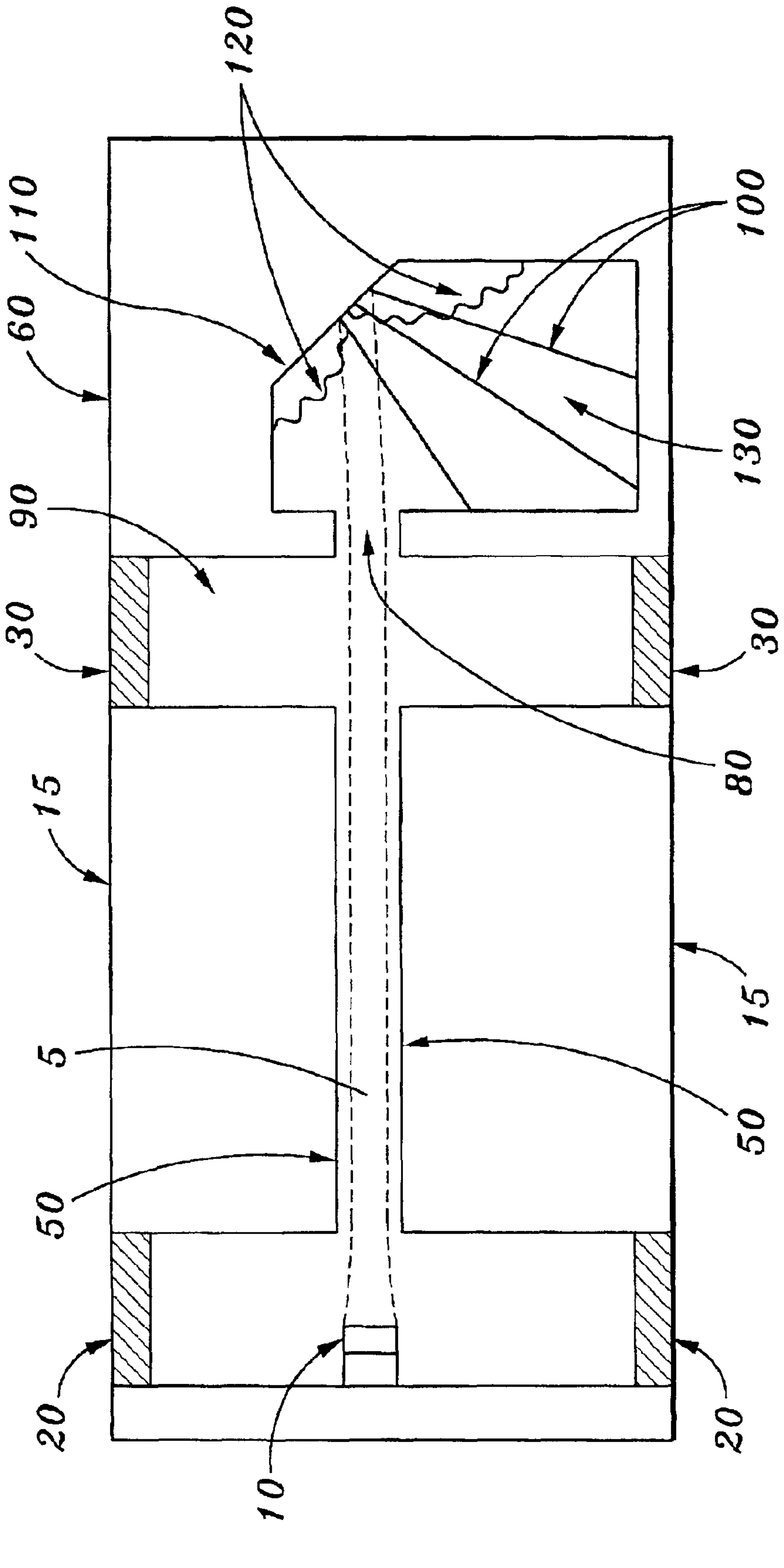
FIG. 1 is a side-sectional view of a depressed collector according to the invention.

The operation of a single stage depressed collector in accordance with an embodiment of the invention in conjunction with a submillimeter frequency Backward Wave Oscillator is schematically illustrated in FIG. 1. A rectangular, sheet electron beam 5 is emitted from cathode 10 and passes through a rectangular beam tunnel 50 through the body 15 of the RF (radio frequency) device. Cathode 10 is energized to a voltage below that of the body sufficient to provide the required electron energy for interaction with the circuit of the device. The voltage potential between cathode 10 and body 15 is determined by analyzing the interaction of the RF circuit with the electron beam generated by the cathode. Insulators 20 are interposed between the body and cathode structure to provide voltage insulation.

Following interaction with the circuit, the spent electron beam passes through spacing 90 and through rectangular aperture 80 into dissipation cavity 130 located in the electron beam collector 60. The incoming electrons impact on surface 110, a conductive reflector, whose normal direction is at an angle with respect to the direction of the incoming electron beam such that reflected primary electrons 100 and true secondary electrons 120 emitted from surface 110 are deflected into and captured by collector cavity 130. Although surface 10 as presented in this embodiment is planar, it can be of any shape—planar, curved, and multi faced—such that electrons which strike it and secondary electrons are directed into cavity 130.

Figure 3:
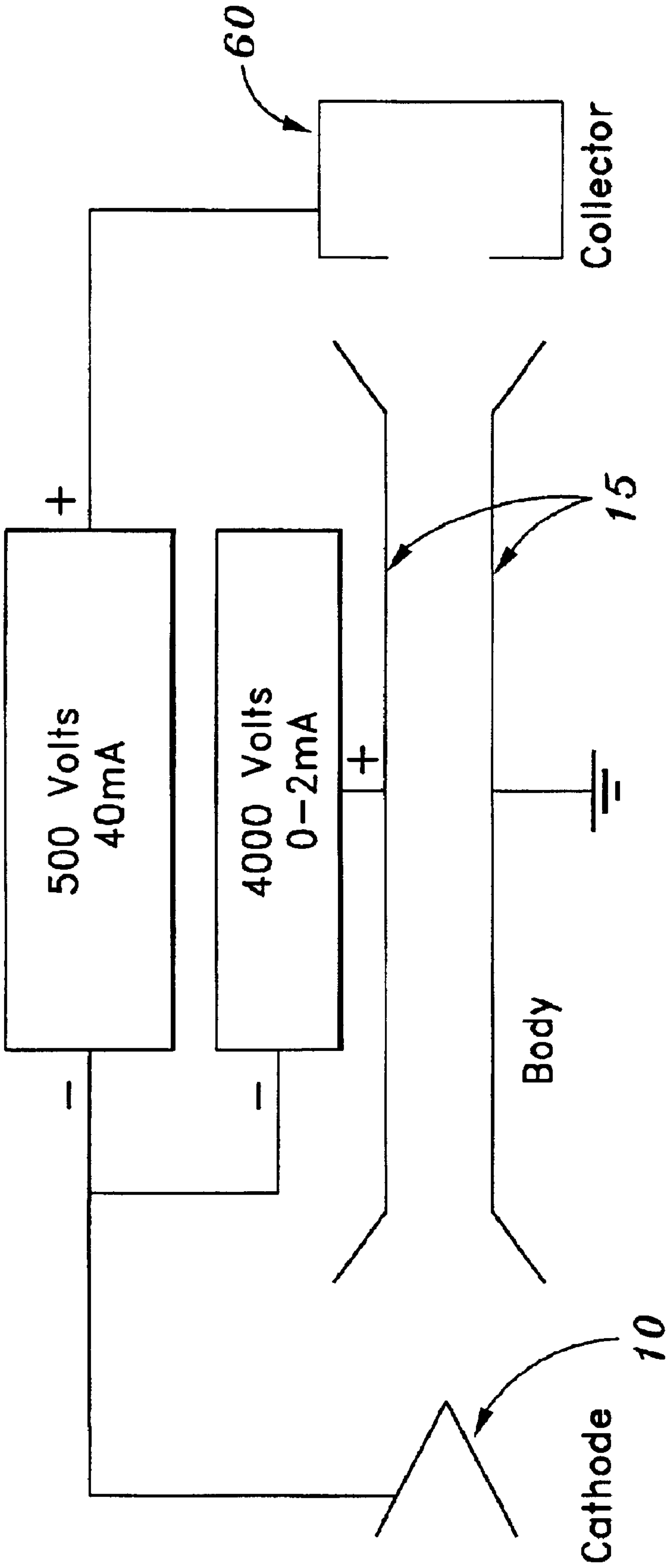
FIG. 3 is an electrical diagram of a typical power supply configuration as applied to the invention.

Collector 60 is energized relative to cathode 10 such that the total voltage difference between collector 60 and cathode 10 is significantly less than the voltage difference between cathode 10 and body 15. Typically cathode 10 is energized at a potential of negative 4000 volts relative to body 15 and collector 60 is energized at a potential of negative 500 volts relative to cathode 10; body 15 may or may not be grounded. The voltage differentials between collector 60 and cathode 10 and between cathode 10 and body 15 are maintained by power supplies. A typical power supply configuration is shown in FIG. 3. Insulator 30 provides electrical isolation between collector 60 and body 15. The voltage applied to the collector is a function of the remaining axial energy of the electrons in the beam following extraction of power for RF generation. This is typically computed using large signal RF design codes and beam optics simulation codes. The depression of the voltage of collector 60 relative to body 15 effectively slows or decelerates the electrons entering the collector 60, reducing their interaction with surface 110 and allowing recovery of beam energy. The voltage applied to collector 60 must be such that the negative voltage applied to the collector does not reflect an unacceptable number of electrons with the lowest amount of axial energy (toward the collector). While some reflection may be acceptable, it becomes unacceptable when the overall efficiency of the device is reduced. The efficiency varies depending on the device type.

Because the device traps secondary and reflected electrons, more than 80% of the spent beam energy in a submillimeter-wave Backward Wave Oscillator can be recovered. As such, the device increases the efficiency of Backward Wave Oscillators by a factor of 4. This reduces the input power requirement for operation of such devices from approximately 300 watts to less than 80 watts. The efficiency improvement for other devices depends on the efficiency of the RF circuit. Sheet beam klystrons, for example, are predicted to operate with circuit efficiencies on the order of 50%. Therefore, a depressed collector based on the invention described here would be predicted to increase the operating efficiency by approximately 20%.

Figure 2:
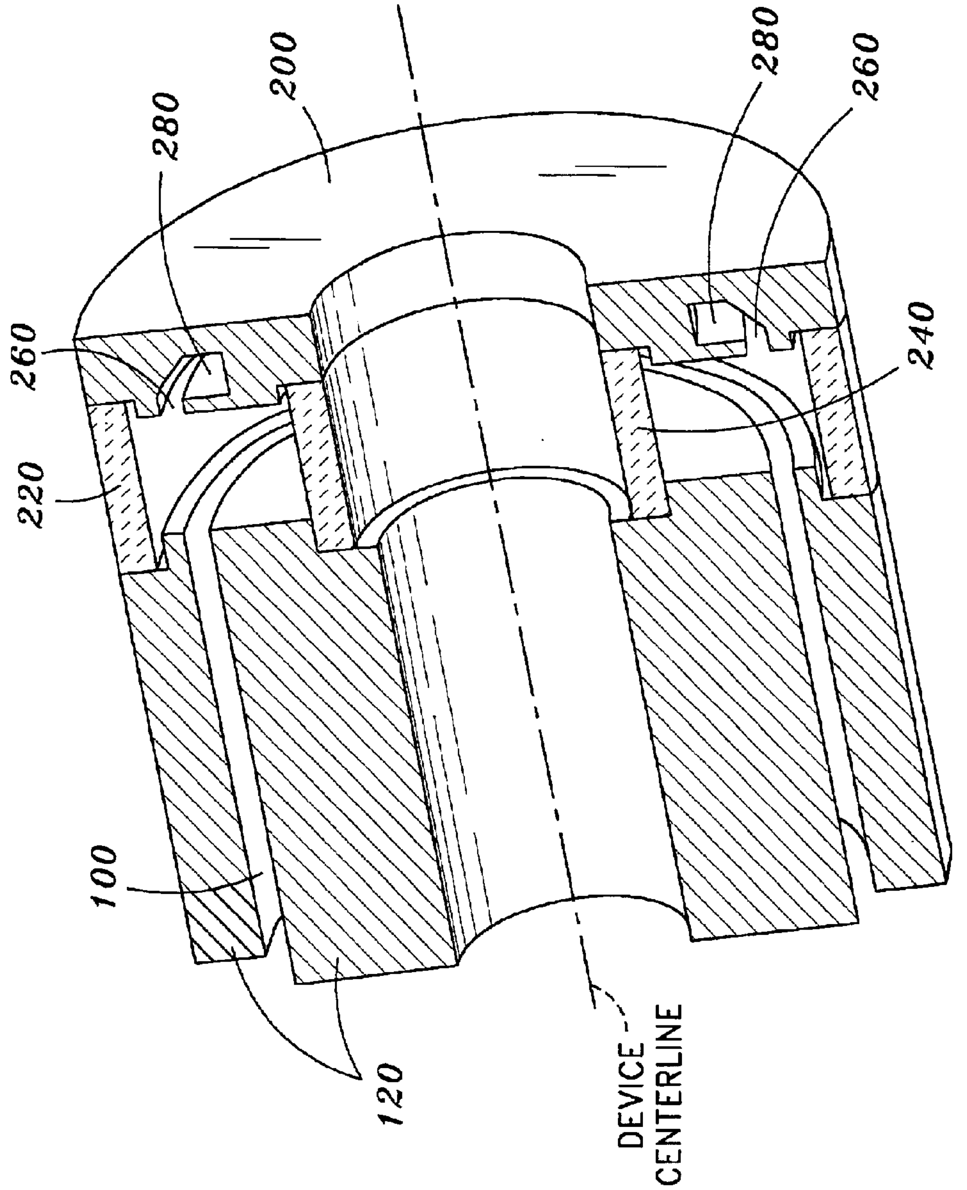
FIG. 2 is a sectional view of a depressed collector applied to an annular beam device.

An alternative embodiment, the application of the invention to large aspect ratio annular electron beams where the thickness of the electron beam 5 is small with respect to the average radius of the electron beam is schematically illustrated in FIG. 2. The thickness of the electron beam in such devices is typically 10 percent or less than the radius of the electron beam. A thin, hollow electron beam, emitted from a cathode (not shown), traverses through annular beam tunnel 100 in the body of the device 120. The cathode is energized at a voltage relative to the body sufficient to provide the required electron energy for interaction with the circuit of the device. The body 120 contains a circuit for converting electron beam power to RF power. Depressed collector 200 is separated from the body 120 by ceramic insulators 220 and 240. The electron beam passes through annular aperture 260 in collector 200 and enters cavity 280 where secondary and reflected primary electrons are trapped and prevented from returning to the body 120 of the device. The cross sectional shape and function of the electron trap is similar to the electron trap described with respect to the sheet electron embodiment and as depicted in FIG. 1. The voltage applied to the collector 200 is reduced relative to body 120 such that energy in the electron beam is recovered, thereby increasing the total efficiency of the device. Collector 200 is energized relative to the cathode (not shown) such that the total voltage difference between collector 200 and the cathode is significantly less than the voltage difference between the cathode and body 120. The voltage differentials between the collector 200 and the cathode and between the cathode and body 120 are maintained by power supplies. A typical power supply configuration is shown in FIG. 3.

Having described various embodiments of the depressed collector with secondary emission trapping for sheet beams and annular electron beams, it should be apparent to those skilled in the relevant art that the afore-stated objects and the advantages for the system have been achieved. The invention was described in connection with particular embodiments, but it is evident that numerous alternatives, variations, modifications and uses will be apparent to those skilled in the art in light of the foregoing description. For example, alternative deflection angles of incoming electron beams, alternative designs of aperture 80 to maximize secondary electron trapping while still providing the maximum possible transmission of the electron beam and alternative materials, voltages and spacings can be selected to vary the operating characteristics the depressed collector as contemplated by the invention. It will also be apparent to those skilled in the art that various other changes and modifications may be made therein without departing from the invention, and it is intended in the claims to cover such changes and modifications as fall within the spirit and scope of the invention.

I claim:

1. A depressed voltage collector for connection to a sub-millimeter electromagnetic wave device containing a cathode and a body generating a rectangular sheet electron beam of electrons traversing into the collector where energy is recovered from the electron beam, said collector comprising:

an electrically conductive dissipation cavity;

a front wall located on one side of said dissipation cavity having a rectangular aperture to allow passage of said rectangular sheet electron beam into said interior cavity;

a conductive reflector electrically and mechanically attached to said interior cavity in said enclosure, opposite said rectangular aperture, positioned at an angle to said incident rectangular sheet electron beam to reflect the electrons into the interior cavity; and means for electrically energizing said collector such that the total voltage difference between said collector and said cathode is significantly less than the voltage difference between said cathode and said device body where said body includes a magnetic field oriented axially to said sheet electron beam, and the strength of said magnetic field is substantially the same in said body as in said collector.

2. A single stage depressed voltage collector for connection to a sub-millimeter electromagnetic wave device containing a cathode and a body generating a rectangular sheet electron beam of electrons traversing into a collector where energy is recovered from the electron beam, said collector comprising:

an electrically conductive dissipation cavity;

a front wall located on one side of said dissipation cavity having a rectangular aperture to allow passage of said rectangular sheet electron beam into said interior cavity;

a conductive and substantially planar reflector electrically and mechanically attached to said interior cavity in said enclosure, opposite said rectangular aperture, positioned at an angle to said incident rectangular sheet electron beam to reflect the electrons into the interior cavity; and means for electrically energizing said collector such that the total voltage difference between said collector and said cathode is significantly less than the voltage difference between said cathode and said device body.

3. An electrically conductive collector for an electron beam comprising primary electrons traveling from a cathode, said electron beam having an axis, said conductive collector including:

an entrance aperture for receiving said electron beam;

a substantially planar impinging surface for interacting with said primary electrons, said interaction generating backscattered primary electrons from said electron beam and optionally secondary electrons from said impinging surface;

said impinging surface angled with respect to said axis, thereby directing said backscattered primary electrons away from said electron beam;

a dissipation cavity for receiving said backscattered primary electrons and said secondary electrons;

where said primary electrons and said backscattered primary electrons have substantially linear trajectories;

and a voltage potential is applied between said conductive collector and said cathode.

4. The collector of claim 3 where said electron beam and said entrance aperture have a cross section which is rectangular.

5. The collector of said claim 3 where said electron beam cross section is elliptical.

6. The collector of claim 3 where said electron beam has an aspect ratio of at least 10:1.

7. The collector of claim 3 where said beam collector is made from graphite.

8. The collector of claim 3 where said dissipation cavity is made from graphite.

9. The collector of claim 3 where said impinging surface is graphite.

10. The collector of claim 3 where said electron beam and said collector are in a uniform magnetic field having an orientation parallel to said axis.

11. The collector of claim 3 where said voltage potential results in a minimum number of said primary electrons reflecting to said entrance aperture.

12. The collector of claim 3 where said electron beam travels through a beam tunnel having an axial magnetic field, and said axial magnetic field is substantially uniform in said beam tunnel and said collector.

13. An electrically conductive collector for an electron beam traveling from a cathode through a beam tunnel to said collector, said beam tunnel and said collector having a common magnetic field parallel to said electron beam, said collector including:

a entrance aperture for receiving said electron beam;

a substantially planar impinging surface for interacting with said electron beam, said interaction generating backscattered primary electrons from said electron beam and optionally secondary electrons from said impinging surface;

a dissipation cavity for receiving said backscattered primary electrons and said secondary electrons;

where said backscattered primary electrons and said secondary electrons are directed away from said beam tunnel;

and a voltage potential is applied between said conductive collector and said cathode.

14. The collector of claim 13 where said electron beam and said entrance aperture have a cross section which is rectangular.

15. The collector of claim 13 where said electron beam cross section is elliptical.

16. The collector of claim 13 where said electron beam has an aspect ratio of at least 10:1.

17. The collector of claim 13 where said beam collector is made from graphite.

18. The collector of claim 13 where said dissipation cavity is made from graphite.

19. The collector of claim 13 where said impinging surface is graphite.

20. The collector of claim 13 where said primary electrons have trajectories which are substantially linear from said entrance aperture to said impinging surface.

21. The collector of claim 13 where said electron beam is formed from primary electrons and said voltage potential results in a minimum number of said primary electrons reflecting to said cathode.

22. The collector of claim 13 where said backscattered primary electrons have trajectories which are substantially linear.

23. An electrically conductive collector for a large aspect ratio annular electron beam traveling from a cathode, through a beam tunnel, and to said collector;

said annular electron beam having an axis and an annular electron density beam profile perpendicular to said axis including said electron density from a first radius to a second radius, said conductive collector including:

an annular entrance aperture for receiving said electron beam;

an impinging surface which is circularly symmetric about said axis, said impinging surface for interacting with said electron beam, said interaction generating backscattered primary electrons from said electron beam and optionally secondary electrons from said impinging surface;

a dissipation cavity for receiving said backscattered primary electrons and said secondary electrons;

said backscattered primary electrons and said secondary electrons directed away from said beam tunnel;

and a voltage potential is applied between said conductive collector and said cathode.

24. The collector of claim 23 where said beam collector is made from graphite.

25. The collector of claim 23 where said dissipation cavity is made from graphite.

26. The collector of claim 23 where said impinging surface is graphite.

27. The collector of claim 23 where said electron beam and said collector are in a uniform magnetic field having an orientation parallel to said axis.

28. The collector of claim 23 where said electron beam is formed from primary electrons and said voltage potential results in a minimum number of said primary electrons reflecting to said cathode.

29. The collector of claim 23 where said electron beam travels through a beam tunnel having an axial magnetic field, and said axial magnetic field is substantially uniform in said beam tunnel and said collector.

* * * * *

UNITED STATES PATENT AND TRADEMARK OFFICE

CERTIFICATE OF CORRECTION

PATENT NO. : 6,838,829 B2
APPLICATION NO. : 10/038016
DATED : January 4, 2005
INVENTOR(S) : R. Lawrence Ives It is certified that error appears in the above-identified patent and that said Letters Patent is hereby corrected as shown below:

Column 3 line 10 “surface 10” should be changed to --surface 110--

Column 4 line 22 “The invention” should be changed to --The present invention--

Claim 5, Column 5 line 46 “said claim 3” should be changed to --claim 3--

Claim 13, Column 6 line 4 “a entrance” should be changed to --an entrance--

Signed and Sealed this

Thirteenth Day of January, 2009

JON W. DUDAS
*Director of the United States Patent and Trademark Office*